Figure 1:
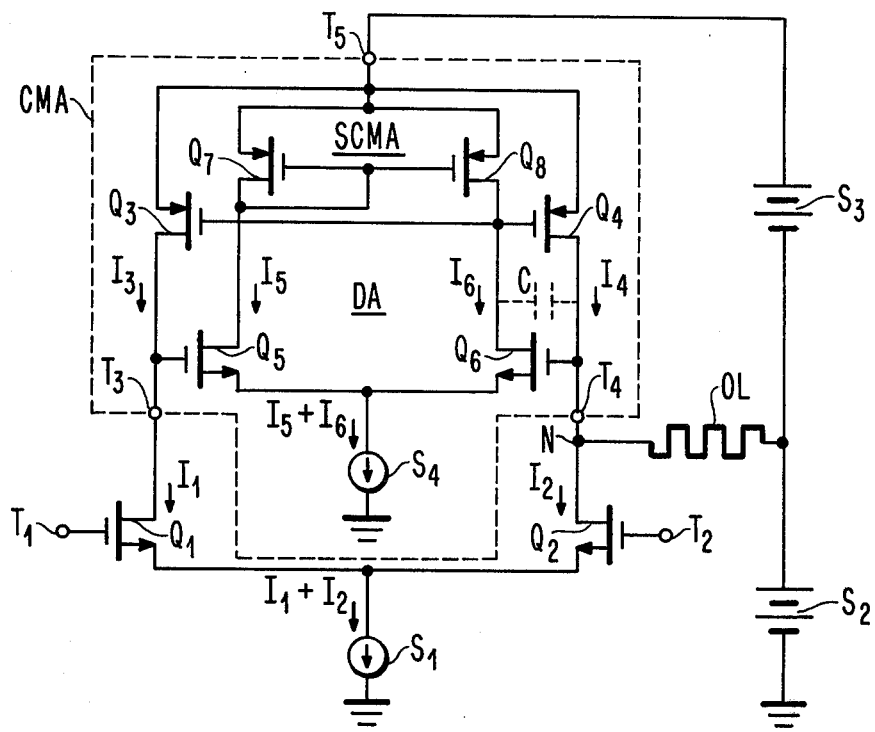

United States Patent [19]
Ahmed

[11] 4,068,184
[45] Jan. 10, 1978

[54] CURRENT MIRROR AMPLIFIER

[75] Inventor: Adel Abdel Aziz Ahmed, Annandale, N.J.

[73] Assignee: RCA Corporation, New York, N.Y.

[21] Appl. No.: 768,593

[22] Filed: Feb. 14, 1977

[51] Int. Cl.² ............................................. H03F 3/45
[52] U.S. Cl. .................................. 330/257; 330/288; 330/277
[58] Field of Search ................... 323/4; 330/22, 30 D, 330/35

[56] References Cited
U.S. PATENT DOCUMENTS

| | | | |
|---|---|---|---|
| 3,760,288 | 9/1973 | Leonard | 330/30 D |
| 3,887,879 | 6/1975 | Radovsky | 330/22 X |

*Primary Examiner*—Lawrence J. Dahl
*Attorney, Agent, or Firm*—H. Christoffersen; A. L. Limberg

[57] ABSTRACT

A current mirror amplifier in which the potentials appearing across the principal conduction paths of its master and slave transistors are maintained substantially the same. This is done by a differential-input, single-ended output amplifier, which is connected as a noninverting amplifier in the direct-coupled feedback connection that conditions the master transistor to conduct applied input current via its principal conduction path.

3 Claims, 2 Drawing Figures

U.S. Patent   Jan. 10, 1978   4,068,184

CURRENT MIRROR AMPLIFIER

The present invention relates to transistor amplifiers and more particularly to current mirror amplifiers.

A current mirror amplifier is defined in connection with the present invention as an amplifier having a current gain substantially equal to the transconductance of a slave transistor divided by the transconductance of a master transistor. Each transistor has first and second electrodes and a principal conduction path therebetween and has a control electrode, with the conductances of the principal conduction path controlled in response to potential applied between the first and control electrodes. The master transistor has an input current applied to its principal conduction path and is provided with direct-coupled feedback between its second and control electrodes to apply a potential between its first and control electrodes that conditions its principal conduction path to conduct all or substantially all the input current. The potential between the first and control electrodes of the master transistor is applied between the first and control electrodes of the slave transistor to condition its principal conduction path to conduct the desired level of output current.

A basic reason for using a current mirror amplifier is that its current gain being determined by the ratio between the transconductances of its slave and master transistors, and the transconductances of transistor devices relying directly on certain physical dimensions that are readily proportioned as between transistors, the current gain of the current mirror amplifier can be accurately predicted despite shared variations in the transistors. Ideally, this current gain is constant despite expected changes in input and output current, potential levels and shared temperature variations.

Field effect transistors (FET's) can be used as the master and slave transistors. The first and second electrodes of an FET correspond to its source and drain electrodes; its principal conduction path is its channel; and its control electrode is its gate electrode. However, the transconductance of a FET changes, not only as a function of its physical dimensions, but also as a function of its source-to-drain potential. This dependence of FET transconductance upon source-to-drain potential is a substantially stronger second order effect than the dependence of the transconductance of a bipolar transistor on its emitter-to-collector potential; both effects are often referred to as "Early effect." Current mirror amplifier configurations in which the potentials appearing across the principal conduction paths of the master and slave transistors are not constrained to be equal, have undesirable inaccuracies in current gain when these transistors are FET's.

The present invention is embodied in a current mirror amplifier in which the potentials appearing across the principal conduction paths of its master and slave transistors are maintained substantailly the same by a differential-input single-ended-output amplifier, which is connected as a non-inverting amplifier in the direct-coupled feedback connection of the master transistor.

Figure 2:
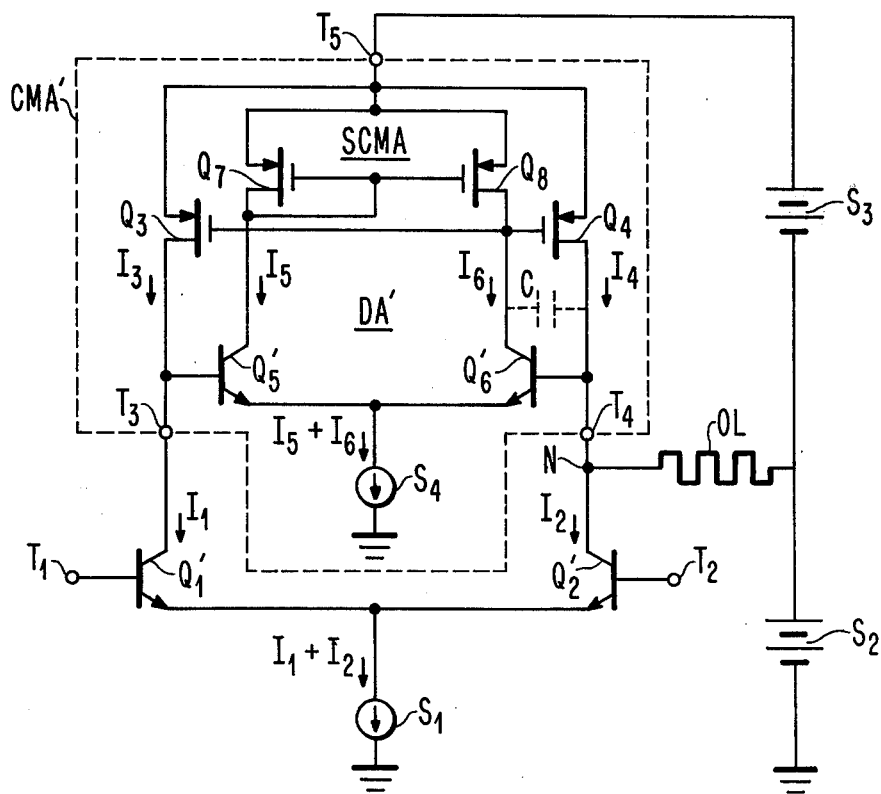

In the drawing:

FIG. 1 is a schematic diagram of a complementary-conductivity FET amplifier, which includes for balanced-to-single-ended signal conversion purposes a current mirror amplifier embodying the present invention; and FIG. 2 is a schematic diagram of a similar amplifier constructed with P-channel FET's and NPN bipolar transistors, which amplifier also includes a current mirror amplifier embodying the present invention.

FIG. 1 shows a long-tailed pair configuration comprising transistors $Q_1$ and $Q_2$ and a constant current generator $S_1$ that demands a current $I_1 + I_2$. $Q_1$ and $Q_2$ supply drain currents $I_1$ and $I_2$ that exhibit variations that are balanced with respect to each other, responsive to differential-mode potential applied between the non-inverting and inverting input terminals $T_1$ and $T_2$ connected to their respective gate electrodes. A current mirror amplifier CMA has an input terminal $T_3$ connected to the drain electrode of $Q_1$, has an output terminal $T_4$ connected to the source node N as the drain electrode of $Q_2$, and has a common terminal $T_5$. Current mirror amplifier CMA functions as a balanced-to-single-ended signal converter, inverting the differential-mode signal variations in the drain current $I_1$ of $Q_1$ for application to node N where they combine constructively with the different-mode signal variations in the drain current $I_2$ of $Q_2$. To satisfy Kirchoff's Law of Currents, the combined differential-mode current components flow through output load OL, developing a signal voltage thereacross in accordance with Ohm's Law.

Common-mode direct current components of the drain current of $Q_2$ and the output current of CMA combine destructively at node N, satifying Kirchoff's Law of Currents, so that no direct current responsive to these common-mode components flows through output load OL connected between node N and the positive terminal of voltage supply $S_2$. So the direct component of potential at node N — that is, the quiescent potential — is the same as that at the positive terminal of supply $S_2$, connected at its negative terminal to reference ground, assuming that the direct component present in the applied signal is zero.

A further voltage supply $S_3$ is connected at its negative terminal to the positive terminal of voltage source $S_2$, and the positive terminal of $S_3$ has the common terminal $T_5$ of current mirror amplifier CMA connected to it.

$Q_3$ and $Q_4$ are the master and slave transistors, respectively, in the CMA. The drain electrodes of $Q_3$ and $Q_4$ are connected to the input terminal $T_3$ of CMA and to the output terminal $T_4$ of CMA, respectively, and their source electrodes are connected to the common terminal $T_5$ of the CMA. Direct-coupled drain-to-gate feedback is applied to $Q_3$ by a differential-input, single-ended-output amplifier DA. Gate-to-gate connection provides $Q_3$ and $Q_4$ with like gate potentials. As with any feedback system, some capacitance such as C shown in dotted outline may be needed to augment the stray capacitance inherent in the current mirror amplifier CMA, to assure stability against self-oscillatory tendencies.

DA comprises: (a) FET's $Q_5$ and $Q_6$ connected in long-tailed pair configuration with constant current generator $S_4$, which demands a current $I_5 + I_6$; (b) FET's $Q_7$ and $Q_8$ connected in a subsidiary current mirror amplifier configuration SCMA; and (c) connection to the subsidiary current mirror amplifier SCMA as a balanced-to-single-ended signal converter to convert the balanced collector currents $I_5$ and $I_6$ and $Q_5$ and $Q_6$ to single-ended form for application to the gate electrode of $Q_3$. More particularly, the current mirror amplifier SCMA has an input connection at the interconnected drain electrode of $Q_7$ and gate electrodes of $Q_7$ and $Q_8$, an output connection at the drain electrode of $Q_8$, and a common connection at the interconnection of the source electrodes of $Q_7$ and $Q_8$.

A current $I_1$ is withdrawn from input terminal $T_3$ of current mirror amplifier CMA. If $I_1$ exceeds the drain current $I_3$ of $Q_3$ there is a tendency for the gate electrode of $Q_5$ to be drawn to a potential less positive than the potential at the gate of $Q_6$. This reduces the conduction of $Q_5$ vis-a-vis $Q_6$ in their long-tailed pair connection, causing the portions of the current demand imposed by constant current generator $S_4$ that are satisfied by the source currents of $Q_5$ and $Q_6$ to be respectively relatively small and relatively large. This cuases the drain current $I_5$ of $Q_5$ to be correspondingly small, which current is demanded from the input connection of subsidiary current mirror amplifier SCMA to cause a correspondingly small drain current to be supplied by $Q_8$. The drain current $I_6$ demanded by $Q_6$ being of the same amplitude as the source current of $Q_6$ is relatively large compared to the drain current supplied by $Q_8$. So the potential at the gate electrodes of $Q_3$ and $Q_4$, to which the drain electrodes of $Q_6$ and $Q_8$ connect, is drawn to a less positive potential. This increases the amplitude of the source-to-gate potentials of $Q_3$ and $Q_4$, increasing the conduction of $Q_3$ and $Q_4$ to adjust the drain current $I_3$ of $Q_3$ to equal $I_1$.

On the other hand, if the $I_3$ exceeds $I_1$, there is a tendency for the gate electrode of $Q_5$ to be drawn to a potential more positive than the potential at the gate electrode of $Q_6$. This increases the conduction of $Q_5$ vis-a-vis $Q_6$, causing $I_5$ to be relatively large compared to $I_6$. The relatively large $I_5$ withdrawn from the input connection of SCMA causes the collector current of $Q_8$ to be correspondingly large such that it exceeds $I_6$ in amplitude to draw the potential at the gate electrodes of $Q_3$ and $Q_4$ to more positive value. This reduces the amplitude of the source-to-gate potentials ($V_{GS}$'s) of $Q_3$ and $Q_4$, reducing the conduction of $Q_3$ and $Q_4$ to adjust $I_3$ to equal $I_1$.

If the transconductance of the amplifier DA is made sufficiently large, only a very small difference between the gate potentials of $Q_5$ and $Q_6$ will be required to adjust the conduction of $Q_3$ to make $I_3$ equal to $I_1$. Ideally, of course, zero difference will be required. But in actuality, if $Q_3$ and $Q_4$ have appreciable gate-to-drain potentials, there will be some difference required to compensate for the mismatch in the transconductances ($g_m$'s) of $Q_7$ and $Q_8$ caused by their source-to-drain potentials ($V_{DS}$'s) differing somewhat. The $V_{DS}$ of $Q_7$ will be its own $V_{GS}$. This error can be reduced at lower $V_{DS}$'s for $Q_3$ and $Q_4$, where a difference in their $V_{DS}$'s would cause the most difference between their $g_m$'s, by choosing $I_5 + I_6$ equal to $I_1 + I_2$ times the ratio of the $g_m$'s of $Q_5$ and $Q_6$ to the $g_m$'s of $Q_3$ and $Q_4$. At larger $V_{DS}$'s for $Q_3$ and $Q_4$ the small difference between their $V_{DS}$'s due to offset between the $V_{GS}$'s of $Q_5$ and $Q_6$ does not affect their relative $g_m$'s very much.

Since the $g_m$'s of $Q_3$ and $Q_4$ match well over the entire range, owing to amplifier DA maintaining their $V_{DS}$'s substantially equal, their similar $V_{GS}$'s will cause their source-to-drain currents to be in constant proportion. This is a 1:1 proportion where $Q_3$ and $Q_4$ are devices with matching dimensions, as would be used in a current mirror amplifier such as CMA used for balanced-to-single-ended conversion.

Modifications of the CMA where $Q_3$ and $Q_4$ have transconductances that are in ratio other than 1:1 are possible. Assuming $Q_3$ and $Q_4$ to be monolithic FET's, one can scale their $g_m$'s by making them with channels having differing width-to-length ratios, as is well known. $Q_7$ and $Q_8$ have $g_m$'s in the same ratio as those of $Q_5 Q_6$.

FIG. 2 shows a modification CMA' of the FIG. 1 current mirror amplifier CMA suitable for use in a monolithic integrated circuit technology in which NPN bipolar transistors and P-channel FET's are available. FET's $Q_5$ and $Q_6$ are replaced by the relatively high transconductance bipolar transistors. Only a few millivolts difference will appear between the base potentials of $Q_5'$ and $Q_6'$ despite one being substantially more conductive than the other. So error in the current gain of CMA' due to mismatch of the $V_{DS}$'s of $Q_3$ and $Q_4$ will be virtually non-existant. Some error due to the base currents of $Q_5$ and $Q_6$ will appear in the current gain of CMA', but it will be small so long as the current $I_5 + I_6$ is chosen so as not to be much larger than $I_1 + I_2$.

A number of modifications of the FIG. 1 and FIG. 2 will, in light of this application, suggest themselves to one skilled in the art of integrated circuit design. For example, one may alternatively replace $Q_5$ and $Q_6$ with FET devices having their transconductances multiplied by bipolar transistors. $Q_3$ and $Q_4$ may be provided with source degeneration resistors. Current generators $S_1$ and $S_4$ may be provided by simple resistive connections or from the collector or drain electrodes of fixed-bias transistors. A current mirror amplifier configuration according to the present invention is useful when all the transistors are of bipolar type, including $Q_3$ and $Q_4$, although the need for avoiding Early effect is less acute with bipolar transistors. Diodes may be introduced into the amplifier DA to adjust the $V_{DS}$'s of $Q_7$ and $Q_8$ to more equal value, if the conditions under which the current mirror amplifier is to operate are well defined. All such modifications which are in the spirit of the invention are to be considered within the scope of the following claims.

In the following claims a "transistor" is any current amplifying arrangement having input, common and output electrodes. The term "input" electrode is generic to the base electrode of a bipolar transistor and to the gate electrode of an FET; "common" electrode, to the emitter electrode of a bipolar transistor and to the source electrode of an FET; and "output" electrode to the collector electrode of a bipolar transistor and to the drain electrode of an FET, for example.

What is claimed is:
1. A current mirror amplifier comprising:
an input terminal;
an output terminal;
a common terminal;
first and second transistors of a first conductivity type, having respective input electrodes, having respective common electrodes connected to said common terminal, and having respective output electrodes connected respectively to said input terminal and to said output terminal; and
a differential-input single-ended-output amplifier having non-inverting and inverting input connections respectively at said input terminal and at said output terminal and having an output connection connected to an interconnection between the input electrodes of said first and said second transistors, said amplifier applying a signal to said interconnection having positive polarity when the potential at said non-inverting input connection is positive rela- tive to the potential at said inverting input connection and having negative polarity when the potential at said non-inverting input connection is negative relative to the potential at said inverting input connection.

2. A current amplifier as set forth in claim 1 wherein said differential-input single-ended-output amplifier includes:

third and fourth transistors of a second conductivity type complementary to said first conductivity type, having respective input electrodes to which said input terminal and said output terminal are respectively connected, having respective common electrodes, and having respective output electrodes;

a subsidiary current mirror amplifier having an input connection to which the output electrode of said third transistor connects, having an output connection to which the output electrode of said fourth transistor is connected, and having a common connection;

means for applying quiescent current between the common terminal of said subsidiary current mirror amplifier and an interconnection between the common electrodes of said third and fourth transistors; and means connecting the output connection of said subsidiary current mirror amplifier to said interconnection between the input electrodes of said first and said second transistors.

3. A current mirror amplifier as set forth in claim 2 wherein the common connection of said subsidiary current mirror amplifier is at said common terminal.

* * * * *